US012105128B2

(12) United States Patent
Haub et al.

(10) Patent No.: US 12,105,128 B2
(45) Date of Patent: Oct. 1, 2024

(54) METHOD AND DEVICE FOR IMPEDANCE MONITORING FOR PROTECTION AGAINST ELECTRIC SHOCK

(71) Applicant: Bender GmbH & Co. KG, Gruenberg (DE)

(72) Inventors: Dennis Haub, Giessen (DE); Wolfgang Hofheinz, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 140 days.

(21) Appl. No.: 18/076,647

(22) Filed: Dec. 7, 2022

(65) Prior Publication Data

US 2023/0176102 A1 Jun. 8, 2023

(30) Foreign Application Priority Data

Dec. 7, 2021 (DE) ..................... 10 2021 132 161.1

(51) Int. Cl.
*G01R 27/18* (2006.01)
*G01R 31/28* (2006.01)

(52) U.S. Cl.
CPC ......... *G01R 27/18* (2013.01); *G01R 31/2827* (2013.01)

(58) Field of Classification Search
CPC .... G01R 27/18; G01R 31/2827; H02H 3/162; H02H 5/12; H02H 1/0007
See application file for complete search history.

(56) References Cited

U.S. PATENT DOCUMENTS

2006/0061368 A1* 3/2006 Furse ..................... G01R 31/11 324/519
2012/0206148 A1* 8/2012 Schaefer ................ G01R 27/18 324/509
2015/0255976 A1 9/2015 Hackl et al.
2020/0100830 A1* 4/2020 Henderson ............. A61B 50/22

FOREIGN PATENT DOCUMENTS

DE 102014204038 A1 9/2015
EP 0061704 10/1982
EP 3598151 1/2020
EP 3832324 6/2021
EP 3896463 10/2021

* cited by examiner

*Primary Examiner* — Jermele M Hollington
*Assistant Examiner* — Zannatul Ferdous
(74) *Attorney, Agent, or Firm* — Warren D. Schickli; Stites & Harbison PLLC

(57) ABSTRACT

A method and a device for impedance monitoring for a single-phase or multiphase, ungrounded power supply system. The method comprising the following steps: measuring a complex impedance against ground simultaneously for each active conductor using a measuring device; calculating a complex touch current for each active conductor; testing in the computing unit whether the corresponding complex touch current exceeds a settable body-current threshold value; generating a switch signal in the computing unit upon the body-current threshold value being exceeded; and controlling a switch element using the switch signal for shutting off or isolating the power source.

10 Claims, 1 Drawing Sheet

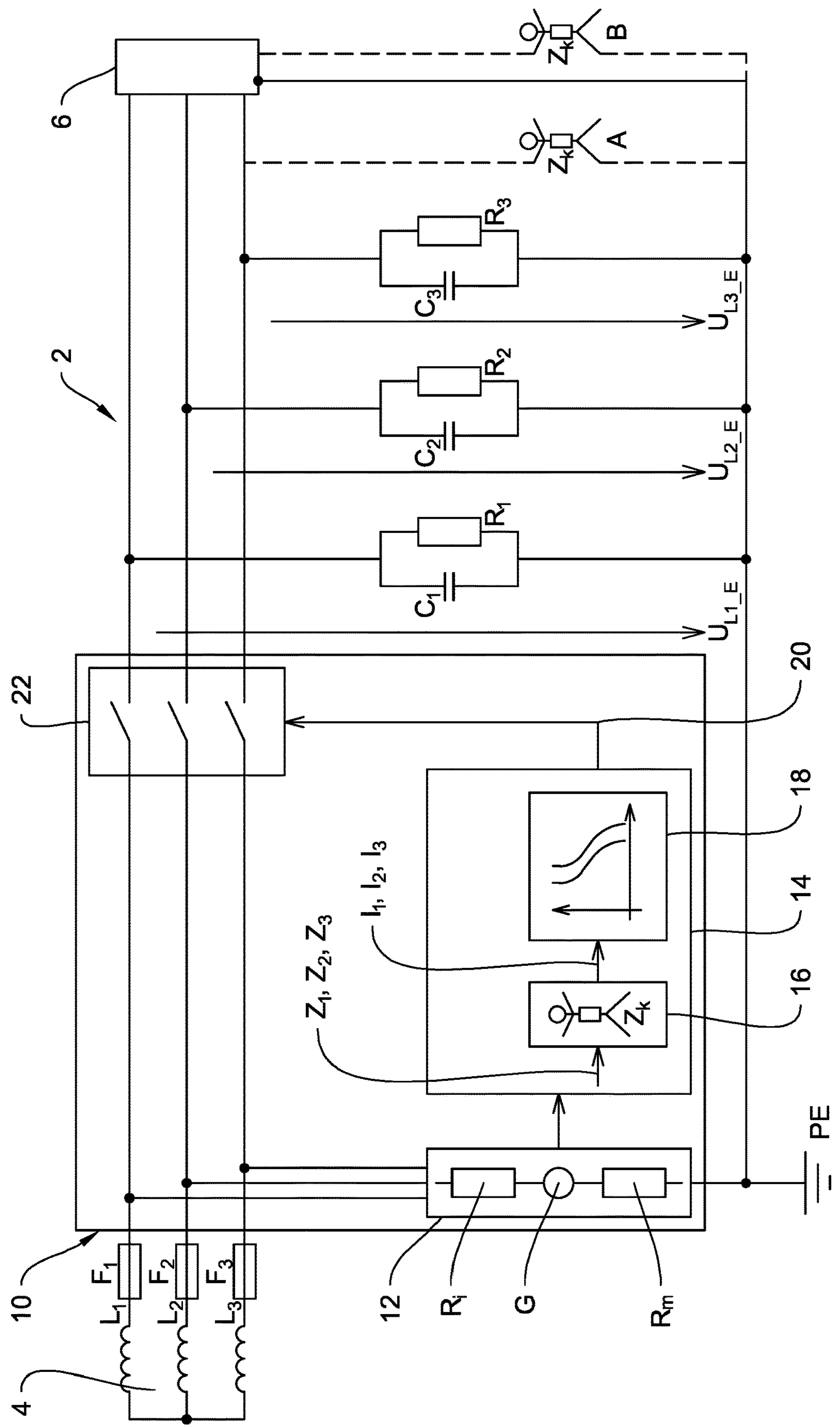
6
Zk
B
Zk
A
R3
C3
UL3_E
2
R2
C2
UL2_E
R1
C1
UL1_E
22
20
18
14
16
I1, I2, I3
Z1, Z2, Z3
Zk
PE
10
F1
F2
F3
L1
L2
L3
4
12
Ri
G
Rm

METHOD AND DEVICE FOR IMPEDANCE MONITORING FOR PROTECTION AGAINST ELECTRIC SHOCK

This application claims priority to German Patent Application No. 10 2021 132 161.1, filed Dec. 7, 2021, the entirety of the contents of which is incorporated by reference herein.

FIELD OF THE INVENTION

The invention relates to a method and a device for impedance monitoring for a single-phase or multiphase ungrounded power supply system.

BACKGROUND OF THE INVENTION

In the scope of basic safety standard VDE 0100-410 and the international equivalent IEC 60364-4-41, protective measures (protection against electric shock) in an ungrounded power supply system are established.

The ungrounded power supply system is also referred to as an insulated network (French: isolée terre—IT) or IT system. In this type of power supply system, the active parts are isolated from the ground potential, i.e., against ground. The advantage of these networks is that the function of the connected electric consumers is not impaired when an insulation fault (first (insulation) fault), such as a ground fault (conductive connection between a live active conductor and ground) or a fault to frame (conductive connection between a live active conductor and the body or casing of a consumer or electric equipment) occurs, as their bodies are grounded individually or together via a protective conductor in an isolated manner from the active conductors of the IT system and thus a circuit cannot become closed because of the ideally infinitely large impedance value (network leakage capacitances are negligible) between an active conductor of the network and ground.

This inherent safety of the ungrounded power supply system can thus ensure a continuous power supply of the consumers fed by the ungrounded power supply system even if a first insulation fault occurs.

The resistance of the ungrounded power supply system against ground (insulation resistance—in the event of a fault also referred to as an insulation fault resistance or fault resistance) is consequently continually monitored, as a fault loop could arise via the protective conductor because of another possible fault, such as another ground fault, fault to frame or through physical contact with a person, at another active conductor (second (insulation) fault) and the flowing fault current in conjunction with an overcurrent protective device would result in a shutting off of the installation with an operational standstill.

The protection against electric shock is expected to prevent a dangerous electric current from flowing through the human body (personal security) or the body of an animal. The standard cited above does not preclude the circumstance of touching an active conductor (direct physical contact) in the ungrounded power supply system after the basic insulation has failed; however, the ungrounded power supply system is only observed in connection with the protective measure "automatic shut-off of the power supply under the assumption of two insulation faults without resistance at different active conductors".

A prerequisite of the protective effects stipulated by the standards mentioned above is that the bodies of the connected consumers having conductive casings (electric equipment of protection class 1) are connected to the protective conductor with a low impedance and the protection is ensured at another active conductor (second fault) for automatic shut-off via a specific overcurrent protective device when a device casing, for example, is touched (indirect physical contact) after a body or ground fault (first fault) and after another insulation fault without resistance.

From the state of the art, continuous monitoring of the insulation resistance is known to be implemented using an insulation monitoring device according to product standard IEC 61557-8; however, as described above, the insulation monitoring only takes place regarding the indirect physical contact of the electric equipment in the ungrounded power supply system with an intact protective conductor. Other known methods also presume a functional protective conductor connection of the electric equipment in order to determine the insulation resistance.

Application documents DE 10 2014 204 038 A1 discloses a method for insulation monitoring of an ungrounded power supply system, where the insulation resistance is determined separately for each phase conductor.

Application documents EP 3 832 324 A1 also discloses a circuit arrangement for determining an insulation resistance in an ungrounded power supply system, a phase-selective determination from a complex-valued insulation impedance being possible, though only for shut-off parts of the ungrounded power supply system.

Furthermore, application documents EP 3 598 151 A1 shows the phase-selective distribution of a total insulation resistance and a total network leakage capacitance in an ungrounded power supply system.

Specification EP 0 061 704 B1 disclose a method for determining the total leakage impedance and the maximum conductor touch current derivable therefrom in an ungrounded alternative-voltage power supply system.

It has proven disadvantageous in the state of the art mentioned above when possibly dangerous body currents and possible interruptions of the protective conductor are not taken into consideration.

Moreover, normative requirements are unavailable for the event of the touching of an active ungrounded conductor after the basic insulation has failed and the protective conductor fails simultaneously, for example because of an interruption or tearing off or in the general event of high impedance.

There are also no regulations for ungrounded power supply systems for which both the power supply system and the body of the connected consumers are ungrounded. An ungrounded power supply system of this kind is to be introduced in the national and international standardization in future as an II system (French: isloée-isolée).

The considerations pertaining to the invention therefore apply to both an ungrounded power supply system in the form of the IT system and to a future ungrounded power supply system in the form of an II system.

SUMMARY OF THE INVENTION

The object of the invention at hand is therefore to propose a method and a device for an ungrounded power supply system (IT and II system) which are effective even when the protective conductor is interrupted or not available in order to protect against electric shock (personal safety).

This object is attained by a method for monitoring impedances for a single-phase or multiphase, ungrounded power supply system having a power source, active conductors and a consumer, the method comprising the following steps:

measuring a complex impedance against ground simultaneously for each active conductor using a measuring device; computing a complex touch current, which would flow upon a touching of another active conductor (L1, L2, L3) after a first insulation fault has arisen at one of the active conductors (L1, L2, L3), for each active conductor using a computing unit as a quotient from a conductor-to-ground voltage of the corresponding conductor and the parallel connection of the complex impedances, a total-body impedance being added to the complex impedance of that conductor which is touched by the person; testing in the computing unit whether the corresponding complex touch current exceeds a settable body-current threshold value; generating a switch signal in the computing unit upon the body-current threshold value being exceeded; controlling a switch element using the switch signal for shutting off or isolating the power source.

The fundamental idea of the method according to the invention is based on an initial phase-selective determination of the corresponding complex impedance against ground in the ungrounded power supply system to be monitored; on deriving therefrom a complex touch current which would flow when another conductor (second insulation fault) were to be touched by a person by means of a total-body impedance of a settable body current model. If the complex touch current flowing in the event of a touching exceeds a settable body-current threshold value posing a risk to persons, the power source driving the supply current is shut off or isolated.

For this purpose, the complex impedance against ground is first measured simultaneously for each active conductor by means of a measuring device which has a coupling branch for each active conductor. The complex impedance corresponds to the complex-valued insulation resistance of the corresponding active conductor of the ungrounded power supply system and is made up of the real part formed by the (real) insulation resistance and the capacitive imaginary part determined essentially by the leakage capacitances.

The complex touch current is yielded as a quotient from the conductor-to-ground voltage of the corresponding conductor and the parallel connection of the complex impedances. In using a body current model stored in the device and having settable body impedance values, the total-body impedance (of the human body) is taken into account when computing a complex touch current for each active conductor in the manner that the complex impedance of the conductor touched by the person is increased by the total-body impedance.

Subsequently, the corresponding complex touch current associated with the corresponding active conductor is tested in the computing unit to discover whether the touch current exceeds a settable body-current threshold value—with the previously set total-body impedance—in the event of a touch. Body-current threshold values mark the boundary between physiological effects posing different degrees of danger to the persons upon current flowing through the body.

If it is detected that the body-current threshold value is exceeded, the computing unit generates a switch signal.

The switch signal controls a switch element in order to shut off or isolate the power source.

In contrast to methods known from the state of the art for insulation monitoring, it is not the detected insulation resistance but the value of a complex touch current which is taken into consideration as a criterion for identifying risk to persons.

The method according to the invention can thus be used as a monitoring and protective device in conjunction with a switch element with or without isolating properties in the following instances:

a) in the event of indirect touching of a live body of electric equipment of protection class 1 (protective measure with protective conductor) in an interrupted protective conductor in the IT system;
b) in the event of direct touching of an active conductor in an interrupted protective conductor in an IT system;
c) in the event of indirect touching of a live body in an II system; and
d) in the event of direct touching of an active conductor in an II system.

Impedance measuring technology based on this method significantly increases personal safety in ungrounded power supply systems.

In an advantageous embodiment, the body-current threshold value is derived from an implemented current-time characteristic curve which represents a duration of the body current over the level of the body current.

In the current-time characteristic curve, possible body-current threshold values are associated with maximally permissible flow durations (duration of the body current). The cur-rent-time characteristic curve thereby defines a boundary between physiological effects dangerous to different degrees when electricity flows through a body. The maximum time span in which a shut-off or isolation takes place after it has been established that the body-current threshold value has been exceeded (trigger time) results from the flow duration specified by the current-time characteristic curve, meaning an effect dangerous to persons does not arise within this time span when the power source is shut off/isolated. Since the shut-off or isolation takes place as a preventative measure, i.e., before the dangerous complex touch current has occurred, via the method according to the invention, the required triggering times are observed implicitly.

Preferably, one of the shapes shown in FIG. 20 of standard IEC 60479-1 is used as the current-time characteristic curve.

Based on the current-time characteristic curves described in international standard IEC-60479-1:2018, the settable body-current threshold value dangerous to persons, at which the power source is to be shut off or isolated, can be derived.

For the preventative shut-off in the sense of an increase of the protective level, a shut-off device can be used as a switch element. This shut-off device does not have to fulfill the standards requirements for isolation.

Alternatively, the power source is more safely isolated in terms of a protective device via a switch element designed as an isolator suitable according to standard VDE 0100-530 and IEC 60364-5-53.

By safely isolating the power source in conjunction with a trigger time sufficient according to the chosen current-time characteristic curve, protection against electric shock is ensured.

Advantageously, the total-body impedance is formed as a vectorial sum of a settable body inner impedance and a settable main impedance.

The electric impedances of the human body essentially consist of the body inner impedance and skin impedances which together yield the total-body impedance. For computing the complex touch current, a value indicated in standard IEC 60479-1 can be implemented in a settable manner as the value of the total-body impedance, preferably a variable value between 0.5 kΩ and 2 kΩ, and, in a worst-case scenario, be computed using the lowest value.

The corresponding method steps of the method according to the invention are implemented via the structural features of the impedance monitoring device according to the invention. Consequently, the technical effects attained using the method and the advantages resulting therefrom pertain to the impedance monitoring device in equal measure.

For this purpose, the impedance monitoring device is equipped with a measuring device for simultaneously measuring a complex impedance against ground for each active conductor, the impedance monitoring device having a computing unit which is designed for computing a complex touch current which would flow upon a touching of another active conductor (L1, L2, L3) after a first insulation fault has arisen at one of the active conductors (L1, L2, L3) for each active conductor as a quotient of a conductor-to-ground voltage of the corresponding conductor and the parallel connection of the complex impedances, a total-body impedance being added to the complex impedance of that conductor which is touched by the person; for testing whether the corresponding complex touch current exceeds a settable body-current threshold value and for generating a switch signal upon the body-current threshold value being exceeded; and the impedance monitoring device having a switch element which is controlled for shutting off or isolating the power source using the switch signal.

The measuring device is switched between each of the active conductors and ground via a corresponding coupling branch. The corresponding complex impedance are measured simultaneously by means of an active measuring method during which a measuring voltage is superimposed on the network. The corresponding conductor-related measuring circuits lead back to the corresponding coupling branch of the measuring device via the corresponding active conductors of the ungrounded power supply system, via their complex impedances against ground—consisting of the real, ohmic portion and the imaginary, capacitive portion—and via the ground connection of the body of the connected consumer. The measuring current setting itself is detected for each active conductor via a voltage drop at a measuring resistance and is evaluated for determining the complex impedances.

The impedance monitoring device further has a computing unit which determines a complex touch current for each active conductor according to Ohm's Law from the conductor-to-ground voltage of the corresponding conductor and the parallel connection of the complex impedances. In doing so, the total-body impedance is added to the complex impedance of that conductor which comes into contact with the human body.

The complex touch current thus detected for each active conductor is tested in the computing unit to discover whether a settable body-current threshold value dangerous to persons has been exceeded. If an exceedance has been determined, the computing unit generates a switch signal to control a switch element for shutting off or isolating the power source using the switch signal.

Preferably, a current-time characteristic value is stored in the computing unit, the current-time characteristic value representing a duration of the body current via the level of the body current and being derived from the body-current threshold value.

In the computing unit, a current-time characteristic value settable to the electric properties of the ungrounded power supply system to be monitored and as a function of the chosen body current model is implemented from which a body-current threshold value corresponding to the protection goal is yielded.

Preferably, one of the shapes represented in FIG. 20 in standard IEC 60479-1 is used as the current-time characteristic value.

The physiological effect posing a risk to persons of a computed complex touch current and the body-current threshold value to be set can be derived from range boundaries and boundaries represented in FIG. 20 of standard IEC 60479-1 and are implemented as an evaluation gauge when testing the computed complex touch currents.

Furthermore, the impedance monitoring device has a shut-off device as a switch element for preventatively shutting off the power source should it be detected that the body-current threshold value has been exceeded.

If the power source is to be shut off preventatively according to a first insulation fault, a shut-off device is used as a switch element. A shut-off element of this kind as a preventative measure does not have to fulfill the requirements specified in standard VDE 0100-530 and IEC 60364-5-53 regarding an isolation.

Alternatively, the impedance monitoring device has an isolator as a switch element for a standardized isolation of the power source. In this design variation, the power supply of all sections or of individual sections of the electric installation is interrupted for safety reasons by isolating the electric power source.

Preferably, the computing unit is configured for implementing a total-body impedance which is formed as a vectorial sum of the body inner impedance and the skin impedances.

In this context, different body current models having different resistance values for the human body can be stored in the computing unit.

Further advantageous embodiment features are derived from the following description and the drawing which describes a preferred embodiment of the invention using an example.

BRIEF DESCRIPTION OF THE DRAWING FIGURES

The FIGURE shows an impedance monitoring device 10 for an ungrounded power supply system 2.

DETAILED DESCRIPTION

Shown in a functional block diagram is an impedance monitoring device 10 according to the invention for a three-phase, ungrounded power supply system 2 (IT system) in which a power source 4 feeds a consumer 6 via active conductors L1, L2, L3 secured via excess-current cutouts F1, F2, F3. Power supply system 2 is characterized by ohmic insulation resistances R1, R2, R3 and leakage capacitances C1, C2, C3 for corresponding active conductor L1, L2, L3, ohmic insulation resistances R1, R2, R3 and leakage capacitances C1, C2, C3 forming the real part and the imaginary part of the corresponding conductor-specific, complex impedance Z1, Z2, Z3.

Impedance monitoring device 10 has a measuring device 12 which comprises a coupling branch (shown in a simplified manner) between corresponding active conductor L1, L2, L3 and ground PE for each active conductor L1, L2, L3. The coupling branch in turn comprises a coupling resistance Ri, a measuring voltage generator G (which can also be configured together for all three coupling branches) and a measuring resistance Rm.

Via the voltage detected at measuring resistance Rm, corresponding complex impedance Z1, Z2, Z3 is first computed for each active conductor L1, L2, L3 in a computing unit 14.

To determine a complex touch current I1, I2, I3, a body current model 16 having a settable total-body impedance Zk is stored in computing unit 14. Computed complex impedance Z1 or Z2 or Z3 of that conductor with which the human body comes into contact is increased by the value of total-body impedance Zk (series connection of the impedances). By means of conductor-to-ground voltage UL1_E, UL2_E, UL3_E of corresponding conductor L1, L2, L3 and a complex total impedance Zges, corresponding complex touch current I1, I2, I3 can be computed according to Ohm's Law. In doing so, complex total impedance Zges is yielded from the parallel connection of complex impedances Z1, Z2, Z3, total-body impedance Zk being added to corresponding complex impedance Z1 or Z2 or Z3.

In the event of the touching of active conductor L3, the following applies to complex touch current I3:

$$I3 = UL3\_E / Zges$$

$$\text{with } Zges = Z1 \| Z2 \| (Z3 + Zk).$$

Subsequently, corresponding complex touch current I1, I2, I3 is evaluated based on a current-time characteristic curve 18 stored in the computing unit. For this purpose, a test takes place for each complex touch current I1, I2, I3 to discover whether it exceeds a body-current threshold value.

When exceeding a settable body-current threshold value gathered from current-time characteristic curve 18 and posing a risk to persons, a switch signal 20 is generated as soon as an exceedance has been identified.

Switch signal 20 controls a switch element 22 which is configured as a shut-off device or an isolator and which causes power source 4 to be shut off or to be safely isolated according to standards VDE 0100-530 and IEC 60364-5-53.

Furthermore, shown in a simplified manner are case A where direct touching takes place, i.e., a direct contact between the human body and a live active conductor L1, L2, L3 comes to pass, and case B where indirect touching takes place, i.e., a risk arises of an insulation fault applying an electric voltage to parts of the electric installation, such as a motor casing, to which voltage is not applied under normal operating conditions (fault to frame).

The invention claimed is:

1. A method for impedance monitoring for a single-phase or multiphase, ungrounded power supply system having a power source, active conductors and a consumer, the method comprising:

measuring a complex impedance against ground for each active conductor simultaneously using a measuring device;

computing a complex touch current, which would flow upon a touching of another active conductor after a first insulation fault has arisen at one of the active conductors, for each active conductor using a computing unit as a quotient from a conductor-to-ground voltage of the corresponding conductor and the parallel connection of the complex impedances, a total-body impedance being added to the complex impedance of that conductor which is touched by the person;

testing in the computing unit whether the corresponding complex touch current exceeds a settable body-current threshold value;

generating a switch signal in the computing unit upon the body-current threshold value being exceeded; and controlling a switch element using the switch signal for shutting off or isolating the power source.

2. The method according to claim 1, further including deriving the body-current threshold value from an implemented current-time characteristic curve which represents a duration of the touch current over the level of the body current.

3. The method according to claim 2, further including using one of the shapes shown in FIG. 20 of standard IEC 60479-1 as the current-time characteristic curve.

4. The method according to claim 3, further including constituting the total-body impedance as the vectorial sum of a settable body inner impedance and a settable skin impedance.

5. An impedance monitoring device for a single-phase or multiphase, ungrounded power supply system having a power source, active conductors and a consumer, comprising:

a measuring device for simultaneously measuring a complex impedance against ground for each active conductor;

a computing unit configured for computing a complex touch current, which would flow upon a touching of another active conductor after a first insulation fault has arisen at one of the active conductors, for each active conductor as a quotient from a conductor-to-ground voltage of the corresponding conductor and the parallel connection of the complex impedances, a total-body impedance being added to the complex impedance of that conductor which is touched by the person, for testing whether the corresponding complex touch current exceeds a settable body-current threshold value and for generating a switch signal upon the body-current threshold value being exceeded; and a switch element which is controlled for shutting off or isolating the power source using the switch signal.

6. The impedance monitoring device according to claim 5, wherein the computing unit is configured for deriving the body-current threshold value of an implemented current-time characteristic curve which represents a duration of the body current over the level of the body current.

7. The impedance monitoring device according to claim 6, wherein the computing unit is configured to use a shape represented in FIG. 20 of standard IEC 60479-1 as the current-time characteristic curve.

8. The impedance monitoring device according to claim 7, further including a shut-off device as a switch element for preventively shutting off the power source.

9. The impedance monitoring device according to claim 7, further including an isolator as a switch element for standardized isolation of the power source.

10. The impedance monitoring device according to claim 9, wherein the computing unit is configured for implementing the total-body impedance which is formed as the vectorial sum of the body inner impedance and the skin impedance.

* * * * *